(12) United States Patent
Dudek

(10) Patent No.: US 11,271,117 B2
(45) Date of Patent: Mar. 8, 2022

(54) STACKED HIGH-BLOCKING III-V POWER SEMICONDUCTOR DIODE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

(*) Notice: Subject to any disclaimer, the term of this patent is extended or adjusted under 35 U.S.C. 154(b) by 0 days.

(21) Appl. No.: 16/809,292

(22) Filed: Mar. 4, 2020

(65) Prior Publication Data

US 2020/0287059 A1 Sep. 10, 2020

(30) Foreign Application Priority Data

Mar. 4, 2019 (DE) .................. 10 2019 001 459.6

(51) Int. Cl.
*H01L 29/861* (2006.01)
*H01L 29/20* (2006.01)

(52) U.S. Cl.
CPC .......... *H01L 29/8613* (2013.01); *H01L 29/20* (2013.01)

(58) Field of Classification Search
CPC ............. H01L 29/8613; H01L 29/20; H01L 21/02463; H01L 21/02505; H01L 21/02546; H01L 21/02395; H01L 21/02639; H01L 29/0649; H01L 29/861; H01L 29/66204; H01L 29/0657; H01L 29/0638; H01L 29/0684; H01L 2924/12036; H01L 29/66136; H01L 29/8611; H01L 2924/12031; H01L 29/868; H01L 29/2006–207; H01L 21/18–326

See application file for complete search history.

(56) References Cited

U.S. PATENT DOCUMENTS 10,074,540 B2 9/2018 Dudek
10,192,745 B2 * 1/2019 Dudek ................ H01L 31/0304
(Continued)

FOREIGN PATENT DOCUMENTS

CN 103236436 A 8/2013
DE 102016013540 A1 5/2018
(Continued)

OTHER PUBLICATIONS

Ashkinazi, :"GaAs Power Devices", ISBN 965-7094-19-4, pp. 8-9. GaAs Schottky diodes pp. 23-26.

*Primary Examiner* — Shahed Ahmed

(74) *Attorney, Agent, or Firm* — Muncy, Geissler, Olds & Lowe, P.C.

(57) ABSTRACT

A stacked high-blocking III-V power semiconductor diode, with a p+ or n+ substrate layer, a p– layer, an n– region with a layer thickness of 10 μm-150 μm, and an n+ or p+ layer, wherein all layers comprise a GaAs compound, a first metallic contact layer and a second metallic contact layer and a hard mask layer with at least one seed opening, wherein the hard mask layer is integrally bonded to the substrate layer or integrally bonded to the p– layer, the n– region extends within the seed opening and over an edge region, adjacent to the seed opening, of a top side of the hard mask layer and the n– region within the seed opening is integrally bonded to the p– layer or to the n+ substrate layer and in the edge region of the top side of the hard mask layer to the hard mask layer.

20 Claims, 3 Drawing Sheets

(56) References Cited

U.S. PATENT DOCUMENTS

| | | |
|---|---|---|
| 10,263,124 B2 | 4/2019 | Dudek |
| 10,312,381 B2 | 6/2019 | Dudek |
| 10,340,394 B2 | 7/2019 | Dudek |
| 10,784,350 B2 | 9/2020 | Hayashida et al. |
| 2003/0140962 A1* | 7/2003 | Sharps ................ H01L 31/0687 136/249 |
| 2008/0257409 A1 | 10/2008 | Li et al. |
| 2010/0301309 A1* | 12/2010 | Tennant ............. H01L 27/1446 257/21 |
| 2013/0015469 A1 | 1/2013 | Hayashi |
| 2018/0277686 A1* | 9/2018 | Dudek ................... H01L 29/32 |
| 2019/0326446 A1 | 10/2019 | Dudek |

FOREIGN PATENT DOCUMENTS

| | | |
|---|---|---|
| DE | 102016013541 A1 | 5/2018 |
| DE | 102016015056 A1 | 6/2018 |
| DE | 102017002935 A1 | 9/2018 |
| DE | 102017002936 A1 | 9/2018 |
| JP | H09260290 A | 10/1997 |
| JP | 2003318413 A | 11/2003 |
| JP | 2007103905 A | 4/2007 |
| JP | 2010205834 A | 9/2010 |
| WO | WO2017163881 A1 | 9/2017 |

\* cited by examiner

STACKED HIGH-BLOCKING III-V POWER SEMICONDUCTOR DIODE

This nonprovisional application claims priority under 35 U.S.C. § 119(a) to German Patent Application No. 10 2019 001 459.6, which was filed in Germany on Mar. 4, 2019, and which is herein incorporated by reference.

BACKGROUND OF THE INVENTION

Field of the Invention

The present invention relates to a stacked high-blocking III-V power semiconductor diode.

Description of the Background Art

A high-voltage-resistant semiconductor diode from GaAs with $p^+$-n-$n^+$ is known from "GaAs Power Devices" by German Ashkinazi, ISBN 965-7094-19-4, pages 8 and 9. GaAs Schottky diodes are described on pages 23 to 26.

Further stacked high-blocking III-V power semiconductor diodes and corresponding manufacturing processes are also known from the publications DE 10 2016 013 540 A1, DE 10 2016 013 541 A1, DE 10 2016 015 056 A1, DE 10 2017 002 935 A1, CN 1003 236 436 A, US 2008/0 257 409 A1, and DE 10 2017 002 936 A1.

In the case of diodes, residual or leakage currents, which occur in an operation in the reverse direction, in particular over the edges of the planar p-n junctions or the mesa structures, should be as small as possible.

SUMMARY OF THE INVENTION

It is therefore an object of the present invention to provide a device that refines the prior art. The aim in particular is to reduce reverse currents and to increase the breakdown voltage.

In an exemplary embodiment, a stacked high-blocking III-V power semiconductor diode is provided which has a p+ substrate layer with a top side and a bottom side.

The p+ substrate layer comprises a GaAs compound or consists of GaAs.

Furthermore, a p− layer with a top side and a bottom side, and an n− layer with a top side and a bottom side are provided.

The n− layer has a layer thickness of 10 µm-150 µm or in particular a layer thickness between 15 µm and 50 µm or a layer thickness between 20 µm and 40 µm. The p− layer and the n− layer each comprise a GaAs compound or consist of GaAs.

Further, an n+ layer with a top side and a bottom side is provided. The n+ layer comprises a GaAs compound or consists of GaAs.

A first metallic contact layer and a second metallic contact layer are also provided, wherein the first metallic contact layer is integrally bonded to the bottom side of the p+ substrate layer and the second metallic contact layer is integrally bonded to the top side of the n+ layer.

The bottom side of the n+ layer can be arranged above the top side of the n− region. The two layers are preferably integrally bonded to one another.

The bottom side of the p− layer can be preferably integrally bonded at least to part or all of the top side of the p+ substrate layer.

The bottom side of the n− region and the top side of the p− layer are preferably at least partially or completely integrally bonded.

In addition, the stacked high-blocking III-V power semiconductor diode can have a hard mask layer with a top side, a bottom side, and at least one seed opening.

The bottom side of the hard mask layer can be integrally bonded to the top side of the p+ substrate layer or integrally bonded to the top side of the p− layer.

The n− region can be formed over an edge region, adjacent to the seed opening, of the top side of the hard mask layer and above and/or within the seed opening.

The n− region can be preferably integrally bonded to the top side of the p− layer and in the edge region of the top side of the hard mask layer to the hard mask layer. In particular, the n− region within the seed opening is integrally bonded to the p− layer.

Alternatively, according to the invention, a stacked high-blocking III-V power semiconductor diode can be provided, with an n+ substrate layer with a top side and a bottom side. The n+ substrate layer comprises a GaAs compound or consists of GaAs.

Further, an n− region with a top side and a bottom side can be provided. The n− region preferably has a layer thickness of 10 µm-150 µm or preferably a layer thickness between 15 µm and 50 µm or preferably a layer thickness between 20 µm and 40 µm.

The n− region preferably comprises a GaAs compound or consists of GaAs.

A p− layer with a top side and a bottom side is arranged on the top side of the n− region. It is understood that the bottom side of the p− layer is arranged on the top side of the n− layer.

The p− layer comprises a GaAs compound or consists of GaAs.

Further, a p+ layer can be provided. The p+ layer comprises a top side and a bottom side. The p+ layer preferably comprises a GaAs compound or consists of GaAs.

A first metallic contact layer and a second metallic contact layer are also provided, wherein the first metallic contact layer is integrally bonded to the bottom side of the n+ substrate layer. The second metallic contact layer is integrally bonded to the top side of the p+ layer.

The bottom side of the n− region and the top side of the n+ substrate layer can be at least partially integrally bonded. The bottom side of the p− layer is preferably integrally bonded to the top side of the n− region.

The bottom side of the p+ layer can be integrally bonded to the top side of the p− region.

In addition, the stacked high-blocking III-V power semiconductor diode has a hard mask layer with a top side and a bottom side, and a seed opening.

The bottom side of the hard mask layer can be integrally bonded to the top side of the n+ layer.

The n− region extends within the seed opening and over an edge region, adjacent to the seed opening, of the top side of the hard mask layer.

Within the seed opening, the n− region is integrally bonded to the top side of the n+ substrate layer. In the edge region on the top side of the hard mask, the n− region is arranged on the hard mask and is preferably integrally bonded.

The stacked high-blocking III-V power semiconductor diode of the invention can be designed as an n-on-p structure or as a p-on-n structure. It should be noted that the particular substrate layer, i.e., the n+ substrate layer or the p+ substrate layer, and the n+ layer for an n-on-p structure and the p+ layer for a p-on-n structure are each formed as heavily doped semiconductor contact layers. The semiconductor contact layers are integrally bonded either to the first metallic contact layer or to the second metallic contact layer.

In other words, the aforementioned semiconductor contact layers can be formed to be as greatly low-impedance as possible in order to reduce the series resistance in the forward direction, i.e., the conducting direction, and thereby the power loss of the III-V power semiconductor diode.

It is understood that the metallic connection regions can consist entirely or partially of a metal, e.g., gold, in particular of an alloy.

The metallic connection regions can be produced by means of electron beam evaporation or by means of sputtering or, in the case of thicker layers, galvanically as well.

The semiconductor layers of the semiconductor diode can be produced at least partially or completely epitaxially by means of MOVPE. In an alternative production method, the layers are partially produced using liquid-phase epitaxy (LPE).

It is understood that in addition to gallium and arsenic as well as in addition to dopants and/or impurities, a GaAs compound can also comprise further elements of main group III or V, e.g., indium or aluminum.

However, it should be noted that the semiconductor layers or semiconductor regions of the III-V semiconductor diode of the invention comprise at least gallium and arsenic or consist of gallium and arsenic.

The layers can have the fewest possible lattice dislocations or EL2 centers.

For the formation of the seed opening, the full-surface hard mask layer is patterned by means of a mask process. The hard mask layer preferably comprises or consists of $SiO_2$ and/or of $Si_3N_4$.

If the substrate layer is formed as a p+ substrate layer, it should be understood that the p− layer covers the top side of the p+ substrate layer either over the entire area or only within the seed opening, e.g., by deposition after application of the hard mask layer.

For example, the p− layer is grown over the entire surface before the hard mask layer is applied to the p+ substrate layer or alternatively grown after the application of the hard mask layer within the seed opening by selective epitaxy.

The n− region, which forms the drift region of the III-V semiconductor diode, is deposited within the seed opening and beyond the seed opening both in terms of height and width.

Thus, the height of the n− region is greater than the depth of the seed opening or the thickness of the hard mask layer.

In addition, the n− region within the seed opening has a first region with a first diameter and above the seed opening a second region with a second diameter, wherein the first diameter corresponds to the diameter of the seed opening and the second diameter is larger than the diameter of the seed opening.

As a result, the n− region covers an edge region, adjacent to the seed opening, of the surface of the hard mask layer. The edge region surrounds the seed opening at a distance from the seed opening, wherein the distance can vary, for example, depending on the direction, so that the n− region at least covers the seed opening in a projection perpendicular to the hard mask layer.

The overgrowth is realized, for example, in a common MOVPE or LPE step with the deposition of the p− layer.

The further layers can completely or at least substantially enclose the n− region surface adjoining the hard mask layer.

In other words, the further layers each extend from the top side of the hard mask layer over the n− region to the hard mask layer.

Leakage currents in the edge region or current paths running over the edge are suppressed by the hard mask layer.

An advantage of the semiconductor diode of the invention is a particularly high breakdown voltage.

The p+ substrate layer can have a dopant concentration of $1 \cdot 10^{18}$-$5 \cdot 10^{20}$ cm$^{-3}$ and a layer thickness of 2 μm-300 μm or the n+ substrate layer has a dopant concentration of at least $1 \cdot 10^{18}$ cm$^{-3}$ and a layer thickness of 2 μm-300 μm, wherein the n+ layer has a dopant concentration of at least $1 \cdot 10^{18}$ cm$^{-3}$ and a layer thickness of less than 30 μm or the p+ layer has a dopant concentration of $5 \cdot 10^{18}$-$5 \cdot 10^{20}$ cm$^{-3}$ and a layer thickness of less than 30 μm.

The n+ layer can cover the n+ layer completely or at least up to 95% and the second metallic contact layer covers the n+ layer completely or at least up to 95% or the p+ layer covers the n− region completely or at least up to 95% and the second metallic contact layer covers the p+ layer completely or at least up to 95%.

The n− region above the hard mask layer can have a first diameter and the seed opening can have a second diameter, wherein the first diameter is larger than the second diameter at least by a factor of 1.5.

Leakage currents can be reduced or completely prevented by sufficient overgrowth, therefore, by a widest possible edge region around the seed opening which is covered by the n− region.

The seed opening can be formed rectangular, e.g., four-sided or square, and has a width and a length.

The width of the seed opening can run parallel to the direction <011> or <001> or <111> or at an angle of 15° or 30° to the direction <011> or to the direction <001> or to the direction <111> of the substrate layer. The orientation of the seed opening to the underlying layer, in particular the substrate layer, influences the degree of overgrowth.

The top side of the substrate layer can be formed as a GaAs(100) surface or GaAs(111) surface.

At least one of the p-doped layers can comprises zinc. At least one n-doped layer can comprise silicon and/or chromium and/or palladium and/or tin.

According to a further refinement, apart from the substrate layer, all layers of the stacked III-V semiconductor diode are produced epitaxially on the respectively preceding layer, e.g., by means of LPE and MOVPE.

The hard mask layer can be formed of SiO2 and/or Si3N4. It is understood that this does not preclude the hard mask layer from having other foreign atoms, e.g., impurities, or layers in addition to SiO2 or Si3N4.

The hard mask layer can have a layer thickness of 0.5 μm-1 μm. A sufficient layer thickness ensures that leakage currents are reliably suppressed.

A trace can be arranged on the top side of the hard mask layer, wherein the trace is electrically operatively connected to the second metallic contact layer. For example, the trace is arranged peripherally at a distance from the seed opening on the top side of the hard mask layer.

The trace can be spaced apart from the second metallic contact layer, for example, or is arranged directly adjacent to the second metallic contact layer. In this regard, the second metallic contact layer can also extend over the top side of the hard mask layer.

The second metallic contact layer and the trace can be used both for producing an electrical contact and for heat dissipation.

According to a further embodiment, the p− layer can have a dopant concentration of $1·10^{14}$-$1·10^{17}$ cm$^{-3}$ and a layer thickness of 1 μm-40 μm. The n− region preferably has a dopant concentration of $8·10^{13}$-$1·10^{16}$ cm$^{-3}$.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

For reasons of clarity, only a sectional view or cross-sectional view of a III-V semiconductor diode 10 is shown in all figures. It should be noted, however, that all III-V semiconductor diodes 10 shown in the sectional view have either a square or a rectangular or a round perimeter in a plan view.

In other words, in the plan view the III-V semiconductor diodes have the same layer sequences as in the respective cross-sectional view. Furthermore, it applies to all of the illustrated embodiments that III-V semiconductor diode 10 has a top side and a bottom side, wherein the III-V semiconductor diodes are arranged as a so-called "DIE" on a pad as a metal frame or metal carrier, also called a "lead frame," preferably by means of a metallic connecting contact layer formed on the bottom side. The largest possible, in particular full-surface formation of the metallic connection contact layer improves the thermal coupling to the pad.

Furthermore, it should be noted that, starting from the bottom side of the III-V semiconductor diode, all of the semiconductor layers formed are planar.

It should also be noted that a substrate layer, i.e., either a p+ substrate layer or an n+ substrate layer, is formed on the bottom side of the III-V semiconductor diodes in all embodiments shown. It is understood that the substrate layer in the initial state has a thickness between 400 μm and 700 μm, depending on the size of the initial semiconductor substrate wafer. In other words, a 3-inch semiconductor substrate wafer generally has a smaller thickness than a 6-inch semiconductor substrate wafer.

In order to reduce the series resistance in the forward direction, the semiconductor substrate wafer is thinned before the formation of the metallic connection contact layer, wherein, for reasons of mechanical stability, the residual thickness is preferably in a range between 80 μm and 200 μm or preferably in a range between 120 μm and 150 μm.

Figure 1:
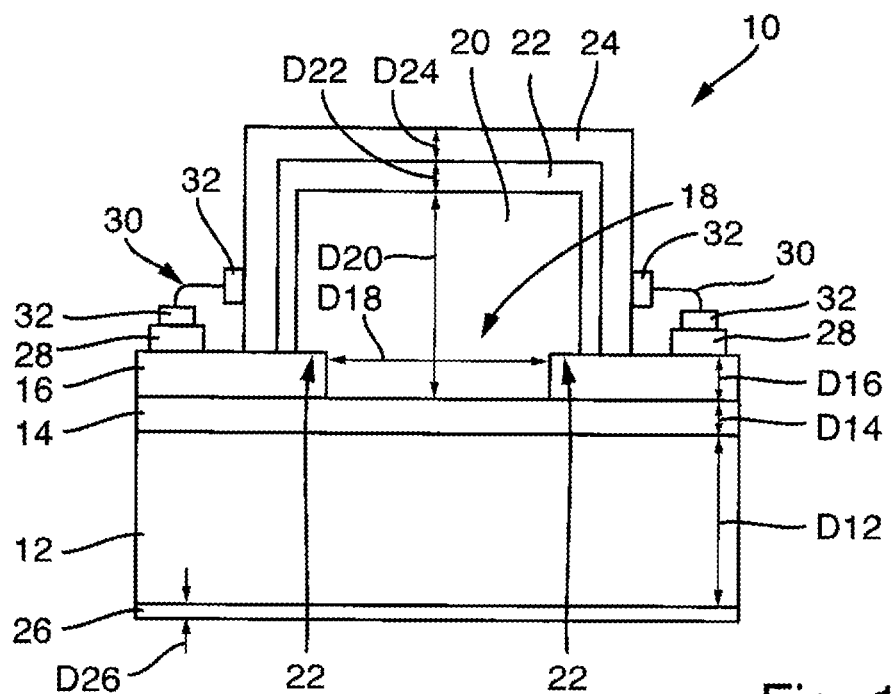
FIG. 1 shows a layer view of an exemplary embodiment of a stacked III-V semiconductor diode.

The illustration in FIG. 1 shows a first embodiment of stacked III-V semiconductor diode 10 with an n-on-p structure. Here, the n-doped semiconductor layers are formed above the p-doped semiconductor layers.

A p− layer 14 with a layer thickness D14 is arranged over the entire surface on a top side of a p+ substrate layer 12 with a layer thickness D12. A hard mask layer 16 with a layer thickness D16 and a seed opening 18 with a width D18 and a length (not shown) (in or out of the image plane) is arranged on a top side of p− layer 14.

An n− region 20 with a height D20 is arranged within seed opening 18 on the top side of p− layer 14, wherein n− region 20 also extends over an edge region 22, adjacent to the seed opening, of a top side of hard mask layer 18 [sic, should be 16]. It is understood that edge region 22 extends around seed opening 18, and n− region 20 extends in all directions beyond seed opening 18 over part of the top side of hard mask layer 16.

A surface, adjoining hard mask layer 16, of n− region 20 is covered or enclosed by an n+ layer 22 with a layer thickness D22. The n+ layer 22 is in turn completely covered or enclosed by a second metallic contact layer 24 with a layer thickness D24.

A first metallic contact layer 26 with a layer thickness D26 is formed flat on a bottom side of p+ substrate layer 12. Metallic contact layer 26 preferably covers the bottom side of p+ substrate layer 12 over the entire area or at least up to more than 90% of the area. This improves the heat dissipation at high current loads.

A trace 28 is arranged peripherally around seed opening 18 and at a distance from seed opening 18 and second metallic contact layer 24, wherein trace 28 is electrically operatively connected to second metallic contact layer 24 via at least one contact wire 30. For this purpose, a bonding surface 32 for the connection of contact wire 30 is formed on trace 28 and on the second contact layer.

Figure 2:
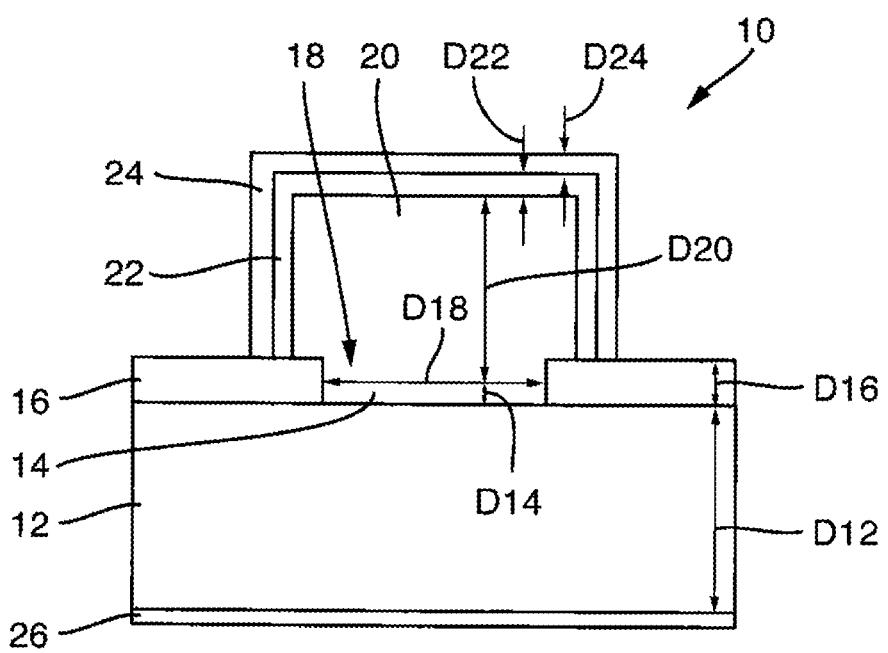
FIG. 2 shows a sectional view of an exemplary embodiment of a stacked III-V semiconductor diode.

A second embodiment of semiconductor diode 10 is shown in the illustration of FIG. 2. Only the differences from the illustration in FIG. 1 will be explained below.

The p− layer 14 of semiconductor diode 10 extends only over the region of the top side of p+ substrate layer 12, the region which is recessed from hard mask layer 16. The n− layer 14 is therefore formed within seed opening 18.

Figure 3:
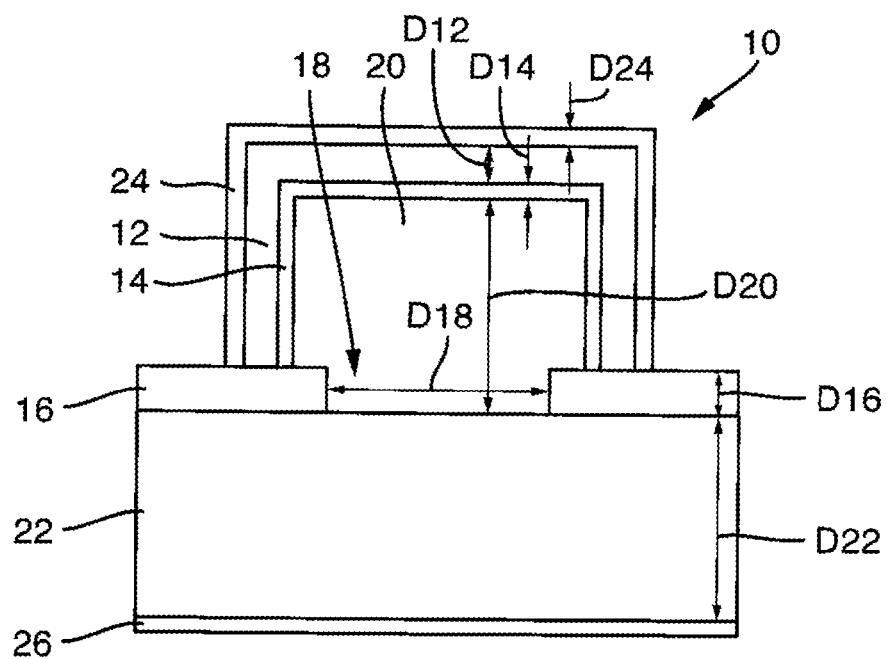
FIG. 3 shows a sectional view of an exemplary embodiment of a stacked III-V semiconductor diode.

A third embodiment is shown in the illustration of FIG. 3. Only the differences from the illustration in FIG. 1 will be explained below.

Stacked III-V semiconductor diode 10 has a p-on-n structure; i.e., n+ layer 22 is formed as n+ substrate layer 22 with a layer thickness D22, and hard mask layer 16 with a layer thickness D16 is arranged on the top side of n+ substrate layer 22.

The p− layer 14 with layer thickness D14 covers the top side of n− region 20, followed by p+ layer 12 with layer thickness D12 and second metallic contact layer 24 with layer thickness D24.

An advantage of implementing the p-on-n structure is that the electrical properties of III-V semiconductor diode 10 improve in that the electrical resistance of the n+ layer is lower at least by a factor of 5 to a factor of 10 than that of the p+ layer. In particular, the effect can be attributed to the large differences in the effective mass of the holes compared with the electrons.

Figure 4A:
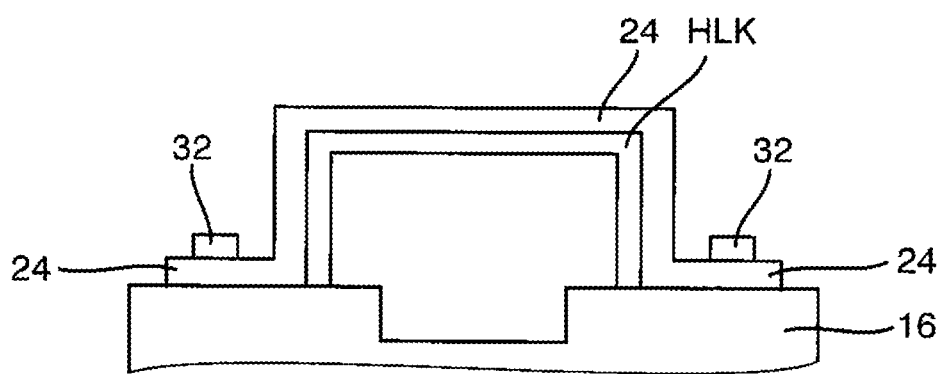
FIGS. 4a to 4c show sectional views of metallization variants of the stacked III-V semiconductor diode according to the exemplary embodiments shown in connection with FIGS. 1 to 3.
Figure 4B:
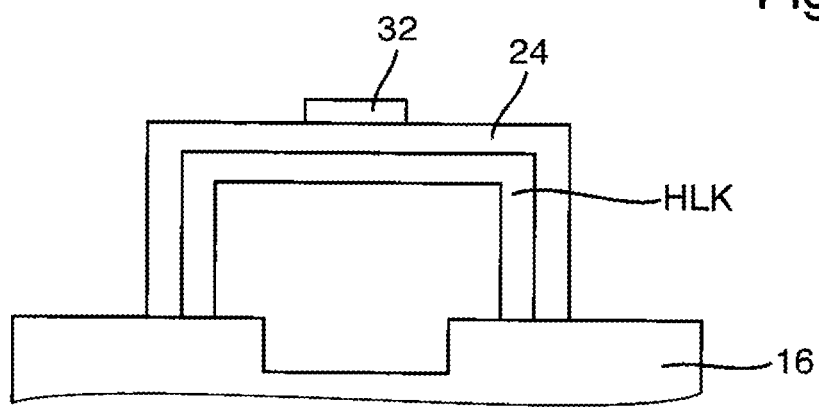
Figure 4C:
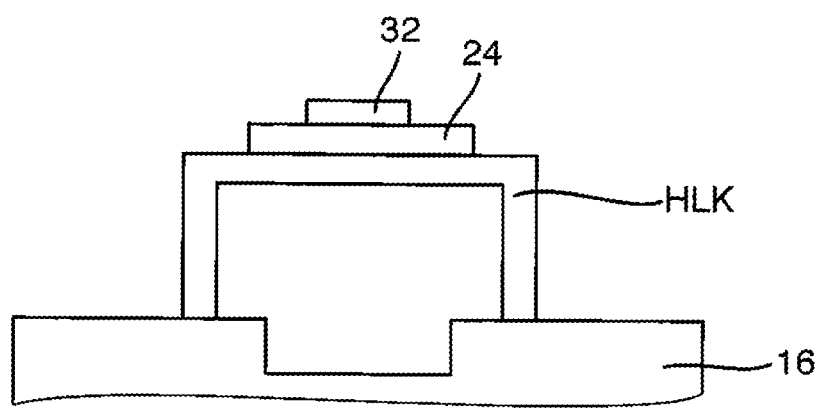

FIGS. 4a-c each show sectional views of a total of three different designs of second contact layer 24 of stack-shaped III-V semiconductor diode 10. For reasons of clarity, only part of the semiconductor layers are shown in each case. A semiconductor contact layer HLK with a top side and a bottom side is formed to represent the n+ layer or the p+ layer.

The top side of the semiconductor contact layer HLK is integrally bonded to second metallic contact layer 24 in all three designs.

At least one bonding surface 32 is formed on the top side of second contact layer 24. A contact wire, which is also referred to as a bonding wire, can be attached to the bonding surfaces (not shown).

In the embodiment of FIG. 4a, second contact layer 24 not only completely surrounds semiconductor contact layer HLK in a first region but is also formed in an encircling manner in a second region on the top side of hard mask layer 16. In the second region, two bonding surfaces 32 are formed on the top side of second contact layer 24. A contact wire, which is also referred to as a bonding wire, can be attached to the bonding surfaces (not shown).

In the embodiment in FIG. 4b, second contact layer 24 encloses the semiconductor contact layer HLK in a first region. Bonding surface 32 is formed on the top side of second contact layer 24.

In the embodiment of FIG. 4c, second contact layer 24 is formed in a first region only on the cover surface of the semiconductor contact layer HLK; i.e., second contact layer 24 is not formed on the side surfaces of the semiconductor contact layer HLK. Bonding surface 32 is formed on the top side of second contact layer 24 formed on the cover surface.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked high-blocking III-V power semiconductor diode comprising:
   a p+ substrate layer with a top side and a bottom side and comprising a GaAs compound or consisting of GaAs;
   a p− layer with a top side and a bottom side and comprising a GaAs compound or consisting of GaAs;
   an n− region with a top side, a bottom side, a layer thickness of 10 μm-150 μm and comprising a GaAs compound or consisting of GaAs;
   an n+ layer with a top side and a bottom side and comprising a GaAs compound or consisting of GaAs;
   a first metallic contact layer and a second metallic contact layer, the first metallic contact layer being integrally bonded to the bottom side of the p+ substrate layer, the second metallic contact layer being integrally bonded to the top side of the n+ layer,
   a hard mask layer with a top side, a bottom side, and at least one seed opening, the bottom side of the hard mask layer being integrally bonded to the top side of the p+ substrate layer or integrally bonded to the top side of the p− layer,
   wherein the n− region extends over an edge region, adjacent to the seed opening of the top side of the hard mask layer and above or within the seed opening, and
   wherein the n− region is arranged within the seed opening and arranged in the edge region on the top side of the hard mask layer.

2. A stacked high-blocking III-V power semiconductor diode comprising:
   an n+ substrate layer with a top side and a bottom side and comprising a GaAs compound or consisting of GaAs;
   an n− region with a top side, a bottom side, a layer thickness of 10 μm-150 μm and comprising a GaAs compound or consisting of GaAs;
   a p− layer with a top side and a bottom side and comprising a GaAs compound or consisting of GaAs;
   a p+ layer with a top side and a bottom side and comprising a GaAs compound;
   a first metallic contact layer and a second metallic contact layer, the first metallic contact layer being integrally bonded to the bottom side of the n+ substrate layer, the bottom side of the n− region being arranged above the top side of the n+ substrate layer, the second metallic contact layer being integrally bonded to the top side of the p+ layer; and
   a hard mask layer with a top side, a bottom side, and at least one seed opening, the bottom side of the hard mask layer being integrally bonded to the top side of the n+ layer,
   wherein the n− region extends within the seed opening and over an edge region adjacent to the seed opening of the top side of the hard mask layer, and
   wherein the n− region within the seed opening is integrally bonded to the top side of the n+ substrate layer and in the edge region of the top side of the hard mask to the hard mask layer.

3. The stacked high-blocking III-V power semiconductor diode according to claim 1, wherein the p+ substrate layer has a dopant concentration of $5 \cdot 10^{18}$-$5 \cdot 10^{20}$ cm$^{-3}$ and a layer thickness of 5 μm-300 μm.

4. The stacked high-blocking III-V power semiconductor diode according to claim 1, wherein the n+ layer has a dopant concentration of at least $1 \cdot 10^{18}$ cm$^{-3}$ and a layer thickness of less than 30 μm.

5. The stacked high-blocking III-V power semiconductor diode according to claim 1, wherein the n+ layer covers the n− region completely or at least up to 95% and the second metallic contact layer covers the n+ layer completely or at least up to 10%.

6. The stacked high-blocking III-V power semiconductor diode according to claim 2, wherein the n+ substrate layer has a dopant concentration of at least $1 \cdot 10^{18}$ cm$^{-3}$ and a layer thickness of 5 μm-300 μm.

7. The stacked high-blocking III-V power semiconductor diode according to claim 2, wherein the p+ layer has a dopant concentration of $5 \cdot 10^{18}$-$5 \cdot 10^{20}$ cm$^{-3}$ and a layer thickness of less than 30 μm.

8. The stacked high-blocking III-V power semiconductor diode according to claim 2, wherein the p+ layer covers the n− region completely or at least up to 95% and the second metallic contact layer covers the p+ layer completely or at least up to 95%.

9. The stacked high-blocking III-V power semiconductor diode according to claim 2, wherein the n− region above the hard mask layer has a first diameter and the seed opening has a second diameter, wherein the first diameter is larger than the second diameter by at least a factor of 1.5.

10. The stacked high-blocking III-V power semiconductor diode according to claim 2, wherein the seed opening is formed rectangular and has a width and a length.

11. The stacked high-blocking III-V power semiconductor diode according to claim 6, wherein the width of the seed opening runs parallel to the direction <011> or <001> or <111> or at an angle of 15° or 30° to the direction <011> or to the direction <001> or to the direction <111> of the substrate layer.

12. The stacked high-blocking III-V power semiconductor diode according to claim 1, wherein the top side of the substrate layer is formed as a GaAs.

13. The stacked high-blocking III-V power semiconductor diode according to claim 1, wherein at least one of the p-doped layers comprises zinc.

14. The stacked high-blocking III-V power semiconductor diode according to claim 1, wherein the n-doped layer comprises silicon and/or chromium and/or palladium and/or tin.

15. The stacked high-blocking III-V power semiconductor diode according to claim 1, wherein, apart from the substrate layer, all layers of the stacked III-V semiconductor diode are produced epitaxially on the respective preceding layer.

16. The stacked high-blocking III-V power semiconductor diode according to claim 1, wherein the hard mask layer is formed of SiO2 and/or Si3N4.

17. The stacked high-blocking III-V power semiconductor diode according to claim 1, wherein the hard mask layer has a layer thickness of 0.1 μm-5 μm.

18. The stacked high-blocking III-V power semiconductor diode according to claim 1, wherein a trace is arranged on the top side of the hard mask layer and the trace is connected to the second metallic contact layer.

19. The stacked high-blocking III-V power semiconductor diode according to claim 1, wherein the p− layer has a dopant concentration of $1 \cdot 10^{14}$-$1 \cdot 10^{17}$ cm$^{-3}$ and a layer thickness of 1 μm-20 μm.

20. The stacked high-blocking III-V power semiconductor diode according to claim 1, wherein the n− region has a dopant concentration of $8 \cdot 10^{13}$-$1 \cdot 10^{16}$ cm$^{-3}$.

* * * * *